United States Patent
Morikawa

(10) Patent No.: US 6,920,058 B2
(45) Date of Patent: Jul. 19, 2005

(54) SEMICONDUCTOR MEMORY DEVICE

(75) Inventor: Yoshinao Morikawa, Ikoma (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/769,381

(22) Filed: Jan. 30, 2004

(65) Prior Publication Data

US 2004/0184318 A1 Sep. 23, 2004

(30) Foreign Application Priority Data

Jan. 30, 2003 (JP) .......................... 2003-022805
Dec. 26, 2003 (JP) .......................... 2003-433814

(51) Int. Cl.[7] ............................................ G11C 17/00
(52) U.S. Cl. ........................................ 365/94; 365/104
(58) Field of Search ................... 365/94, 104, 185.17, 365/230.03

(56) References Cited

U.S. PATENT DOCUMENTS 5,757,709 A * 5/1998 Suminaga et al. .......... 365/204
5,892,713 A * 4/1999 Jyouno et al. ............ 365/185.11
6,226,214 B1 * 5/2001 Choi ...................... 365/230.03
6,473,327 B1 * 10/2002 Ishizuka .................... 365/103

FOREIGN PATENT DOCUMENTS

JP          10-11991        1/1998

* cited by examiner

*Primary Examiner*—Anh Phung
(74) *Attorney, Agent, or Firm*—Morrison & Foerster LLP

(57) ABSTRACT

The present invention prevents a reading operation margin from being decreased due to a current injected into a selected bit line after passing through an unselected bit line in a memory cell array configuration using virtual ground lines. A memory cell array is constituted by being divided into at least subarrays of a plurality of columns and memory cell columns at the both ends of the subarrays are constituted so that second electrodes are not connected each other but they are separated from each other between two memory cells adjacent to each other in the row direction at the both sides of boundaries between the subarrays and respectively connected to an independent bit line or virtual ground line, and one of word lines, one of bit lines, and one of virtual ground lines are selected and one memory cell from which data will be read is selected.

21 Claims, 11 Drawing Sheets

(A)

(B)

US 6,920,058 B2

SEMICONDUCTOR MEMORY DEVICE

BACKGROUND OF THE INVENTION

1. Field of the Invention

The present invention relates to a semiconductor memory device, particularly to a semiconductor memory device for reading stored data by selecting a word line, bit line, and virtual ground line to be connected to memory cells from which data will be read and selecting the memory cells.

2. Description of the Related Art

There is a conventional system of reading data from a memory cell by a nonvolatile semiconductor memory device such as a mask ROM (mask programmable Read Only Memory) or a flash memory by using the bit line and a virtual ground line. The method is described below by using a memory cell of a mask ROM having a simple memory cell structure. FIG. 8 shows a conceptual view of a reading system using the virtual ground line. In the case of this system, a bit line and a virtual ground line are alternately arranged along a column direction and word lines are arranged along a row direction on a memory cell array in which memory cells are arranged in the row direction and the column direction like a matrix, a memory cell transistor constituted by a MOSFET is set between a bit line and a virtual ground line adjacent to each other, and the drain and source electrodes of a memory cell transistor are connected to the bit line and the virtual ground line respectively. Moreover, the gate electrode of the memory cell transistor is connected to a word line. A plurality of memory cell transistors is connected to one word line to improve the area efficiency of the memory cell. In the case of these memory cell transistors, a threshold value is set when each of the transistors is fabricated (binary data is programmed for each memory cell) so as to serve as either of a transistor having a high threshold (off transistor having a threshold higher than a high-level potential of a word line serving as a gate electrode and to be normally turned off independently of the word-line potential) and a transistor having a low threshold (on transistor to be turned on when a word line potential is higher than the threshold). In the case of the reading operation, a word line, bit line, and virtual ground line to be connected to a transistor from which data will be read are selected, the selected bit line is charged to a predetermined potential, the selected virtual ground line is grounded to the ground potential, and the selected word line is set to the high level. The difference of currents of an on-transistor and off-transistor under the above state is sensed by a sensing circuit to determine the binary data stored in the memory cell.

In general, a hierarchical bit line system is known for a large-capacity semiconductor memory device as a system for reading data from these memory cell arrays at a high speed. A memory cell array according to the hierarchical bit line system is constituted by dividing a memory cell array into a plurality of blocks, using the bit line of each block as an auxiliary bit line (also referred to as local bit line), and connecting every a plurality of auxiliary bit lines of each block to a main bit line (also referred to as global bit line) through a block selection transistor. A bit line for selecting a memory cell is selected by selecting a main bit line and selecting an auxiliary bit line to be connected to the selected main bit line by the block selection transistor. The reading operation of the hierarchical bit line system is described below by referring to the accompanying drawings. FIG. 9 shows a configuration of a memory array cell according to the hierarchical bit line system. In the case of the memory cell array illustrated in FIG. 9, a virtual ground line also uses the same hierarchical structure as that of a bit line.

A group of memory cells using word lines WL0 to WLn present in a region held by control signals BKL1 and BKL2 and control signals BKL3 and BKL4 of a block selection transistor as gate electrodes is referred to as a block and a plurality of auxiliary bit lines (two bit lines in FIG. 9) SBi (i=even number) is connected to each main bit line MBi(i= even number) every block through a block selection transistor BK1-1 or the like in order to improve the area efficiency of a memory cell. High-speed reading is realized by accessing a memory cell every block through the main bit line.

As shown in FIG. 9, the block selection transistor BK1-1 or the like is selected by a bank selection line BKL1 or the like. A main bit line MB2 or the like is connected to an auxiliary bit line SB4 or the like through the block selection transistor BK11. The main bit line MBi (i=even number) of these memory arrays is connected to a charging circuit 22 and sensing circuit 23 or the like through a block selection circuit 20 for selecting a reading block and a charging/ grounding election circuit 21 and the main virtual ground line MBi (i=odd number) of them is connected to a charging circuit 22 or ground line 24 or the like through the block selection circuit 20 and charging/grounding selection circuit 21. The charging/grounding selection circuit 21, charging circuit 22, and sensing circuit 23 may be connected to a plurality of block selection circuits 20.

The reading operation of the memory cell array circuit shown in FIG. 9 is described below. A case of selecting a memory cell transistor M4 and reading data from the M4 is assumed. The word line WL0 to be connected to the gate of the transistor M4 is set to the high level and other word lines (WLn) are set to the low level. The control signal BKL1 of a block selection transistor is set to the high level in order to turn on the block selection transistor BK1-1, the control signal BKL3 is set to the high level in order to turn on a block selection transistor BK3-2, and other control signals BKL2 and BKL4 are to the low level. Then, a current route (MB2)-(BK1-1)-(SB4) extending from a main bit line to a memory cell and a current route (SB5)-(BK3-2)-(MB3) extending from the memory cell to a main virtual ground line are formed on the transistor M4. When the transistor M4 is an on-transistor, by setting BSEL2 to the high level, VGSEL1 to the high level, BLOCKSEL1 to the high level, BSEL1 to the low level, and VGSEL2 to the lower level, the selected main bit line MB2 has a charging potential, the selected main virtual ground line MB3 has a ground potential, and current circulates through a route of (MB2)- (BK1-1)-(SB4)-(M4)-(SB5)-(BK3-2)-(MB3). By sensing a change or the like of the charging potential of the main bit line MB2 selected by the sensing circuit 24 connected from the selected main bit line MB2 through the transistor TR1 of the block selection circuit 20 and the transistor TR2 of the charging/grounding selection circuit 21, it is determined that the memory cell transistor M4 is an on-transistor.

However, when the memory cell transistor M4 is an off-transistor, transistors M3, M2, M1, and M0 or the like of an unselected memory cell in the same row as the transistor M4 are on-transistors, a current route via the transistors M3, M2, and M1 is formed even if, for example, the transistor M4 is an off-transistor because the word line WL0 serving as a gate line of each transistor is common. That is, when setting the selected main bit line MB2 to a charging potential, a transient current for charging the parasitic capacitance of a bit line or a virtual ground line connected to each memory cell circulates through a route of (MB2)-(BK1-1)-(SB4)-(M3)-(M2)-(M1) . . . . The current circulating through the current route is temporarily referred to as an alternate discharge current. As a result, a current route extended from a selected main bit line to each bit line or virtual ground line is formed as if the transistor M4 from which data will be read is an on-transistor though it is an off-transistor and the operation margin of an erroneous reading operation or reading operation is decreased. To prevent the erroneous reading operation or the like, a method of charging an unselected bit line and an unselected virtual ground line to a predetermined charging potential is conventionally used.

In the case of the circuit illustrated in FIG. 9, an unselected main bit line MB0 and unselected main virtual ground line MB1 are set to a charging potential. An auxiliary bit line SB0 and an auxiliary virtual ground line SB1 are set to a charging potential through a block selection transistor. Thus, even if the memory cell transistors M3, M2, M1, and M0 are on-transistors, an alternate discharge current for reading data from the memory cell transistor M4 disappears and a difference appears in the potential change of the selected main bit line MB2 when the transistor M4 is an on-transistor and an off-transistor and a stable memory-cell reading operation is realized.

However, the system of charging an unselected bit line and unselected virtual ground line for preventing an alternate discharge current decreases the reading operation margin on the other hand when a memory cell transistor from which data will be read is an on-transistor. To solve the problem of the operation margin decrease, Japanese Unexamined Patent Publication No. 10-11991 discloses an improved connection system for a memory cell transistor and a block selection transistor.

Then, it is described that a reading operation margin is decreased by a method of charging an unselected bit line and unselected virtual ground line for preventing an alternate discharge current by using the circuit shown in FIG. 9 as an example.

Though it is already described that the unselected main bit line MB0 and unselected main virtual ground line MB1 respectively have a charging potential because a selected main bit line becomes MB2 and a selected virtual ground line becomes MB3 to charge an unselected bit line and unselected virtual ground line when reading data from the memory cell transistor M4 similarly to the above description, the unselected main bit line MB4 and unselected main virtual ground line MB5 are further charged at the same time. When transistors M5, M6, M7, and M8 or the like in the same row as the transistor M4 are on-transistors, the unselected main bit line MB4 and unselected main virtual ground line MB5 extend through their respective block selection transistors, an auxiliary bit line SB8 and auxiliary virtual ground line SB9 respectively have a charging potential, and a current route extending to (SB8)-(M7)-(M6)-(M5)-(SB5) to charge the selected auxiliary virtual ground line SB5 is formed. The current circulating through the current route is temporarily referred to as alternate injection current. When the memory cell transistor M4 is an on-transistor, the alternate injection current raises the ground potential of the auxiliary virtual ground line SB5 and decreases the reading current of the selected main bit line MB2 circulating through (MB2)-(BK1-1)-(SB4)-(M4)-(SB5)-(BK3-2)-(MB3). The decrease of the reading current not only decreases the reading speed of a memory cell but also decreases a reading operation margin because a selected memory cell transistor may be erroneously read.

Moreover, it is general to read a plurality of memory cell transistors in parallel through one-time reading operation. In the case of the circuit illustrated in FIG. 9, however, it is possible to simultaneously read the memory cell transistor M4 and a memory cell transistor M12. The charging for preventing the current corresponding to the alternate discharge current of the transistor M4 for reading data from the memory cell transistor M12 corresponds to charging the unselected main bit line MB4 and unselected main virtual ground line MB5. Therefore, charging the unselected main bit line MB4 and unselected main virtual ground line MB5 decreases a reading current when the transistor M4 is an on-transistor. However, in the case of data reading when the transistor M12 is an off-transistor, charging the MB4 and MB5 is necessary.

It is possible to increase the number of unselected memory cell transistors present between the transistors M12 and M4, minimize charging an unselected bit line and unselected virtual ground line, and decrease the current corresponding to the alternate injection current flowing into the above-described selected bit line. However, the current corresponding to the alternate injection current is basically present. That is, when all the unselected memory cell transistors present between the transistors M12 and M4 are on-transistors, charging unselected bit lines and unselected virtual ground lines necessary for the data reading when the transistor M12 is an off-transistor decreases the reading current when the transistor M4 is an on-transistor by the current corresponding to the alternate injection current. However, the reading current when the transistor M4 is an on-transistor is still decreased.

The operation margin decrease measure disclosed in Japanese Unexamined Patent Publication No. 10-11991 also decreases the alternate injection current flowing into the selected bit line. Moreover, to restrict the control of these bit line and virtual ground line, the number of cells to be simultaneously read by the same word line is restricted and this greatly prevents the capacity of a memory cell array from increasing.

SUMMARY OF THE INVENTION

It is an object of the present invention to provide a semiconductor memory device capable of preventing a reading operation margin from being decreased due to a current incoming to a selected bit line via an unselected bit line and being increased in capacity and operation speed in a memory cell array configuration using a virtual ground line.

A semiconductor memory device of the present invention comprises a memory cell array constituted by arranging memory cells respectively having one first electrode and a pair of second electrodes and capable of reading stored contents in accordance with a state of the electrical connection between the second electrodes in the row and the column directions like a matrix correspondingly to the potential of the first electrode, connecting the first electrodes of the memory cells in the same row to a common word line, connecting a pair of the second electrodes each other between two of the memory cells adjacent to each other in the row direction, connecting one-hand second electrodes of the memory cells in the same column to a common bit line, and connecting the other-hand second electrodes of the memory cells to a common virtual ground line. The memory cell array is constituted by being divided into subarrays of at least a plurality of columns, and memory cell columns at the both ends of the subarrays are connected to an independent bit line or virtual ground line while the second electrodes are not connected but separated between two of the memory cells adjacent to each other in the row direction at the both sides of boundaries between the subarrays so that one of the word lines, one of the bit lines, and one of the virtual ground lines are selected and one memory cell from which data will be read is selected.

According to the above characteristic configuration, by properly charging an unselected bit line and virtual ground line at the position of a memory cell from which data will be read in order to avoid the alternate discharge current described in the section of Description of Related Art, an alternate injection current due to the charging is cut off at boundaries between subarrays. Therefore, it is possible to avoid erroneous reading and decrease of a reading operation margin due to the alternate injection current. That is, by properly performing decoding for selection of the number of columns of memory cells in subarrays and a bit line or virtual ground line, it is possible to realize a memory cell array capable of preventing a reading operation margin and a reading operation speed from decreasing by completely excluding influences of the above alternate discharge current and alternate injection current.

Moreover, a semiconductor memory device of the present invention for achieving the above object is constituted so that the bit line and the virtual ground line respectively have the function of the both and when one line performs the function of the other line, the other line performs the function of the one line instead of or in addition to the above characteristic configuration constituted so that one of the word lines, one of the bit lines, and one of the virtual ground lines are selected and one memory cell from which data will be read is selected.

A memory cell from which data will be read purposed by the present invention is a memory cell having one first electrode and a pair of second electrodes and capable of reading stored contents in accordance with the state of electrical connection between the second electrodes correspondingly to the potential of the first electrode. However, because of the structure of the memory cell, directions of currents circulating through the second electrodes may be fixed or asymmetric depending on a programmed state. In this case, one of the second electrodes to be connected to a bit line and one of them to be connected to a virtual ground line may depend on a programmed state. For example, when directions of currents for reading one-bit data are opposite to each other in a memory cell capable of storing two-bit data, it is possible to read the two-bit data by isolating the data one bit by one bit by properly alternating a bit line and a virtual ground line. Also in the case of the multi-valued memory cell suitable for increase of a memory cell array in capacity, problems of the alternate discharge current and alternate injection current similarly occur. According to this characteristic configuration, however, it is possible to avoid erroneous reading and decrease of a reading operation margin by excluding influences of these currents.

DETAILED DESCRIPTION OF THE INVENTION

Embodiments of a semiconductor memory device of the present invention (hereafter properly referred to as "present invention device") are described below by referring to the accompanying drawings.

[First Embodiment]

Figure 1:
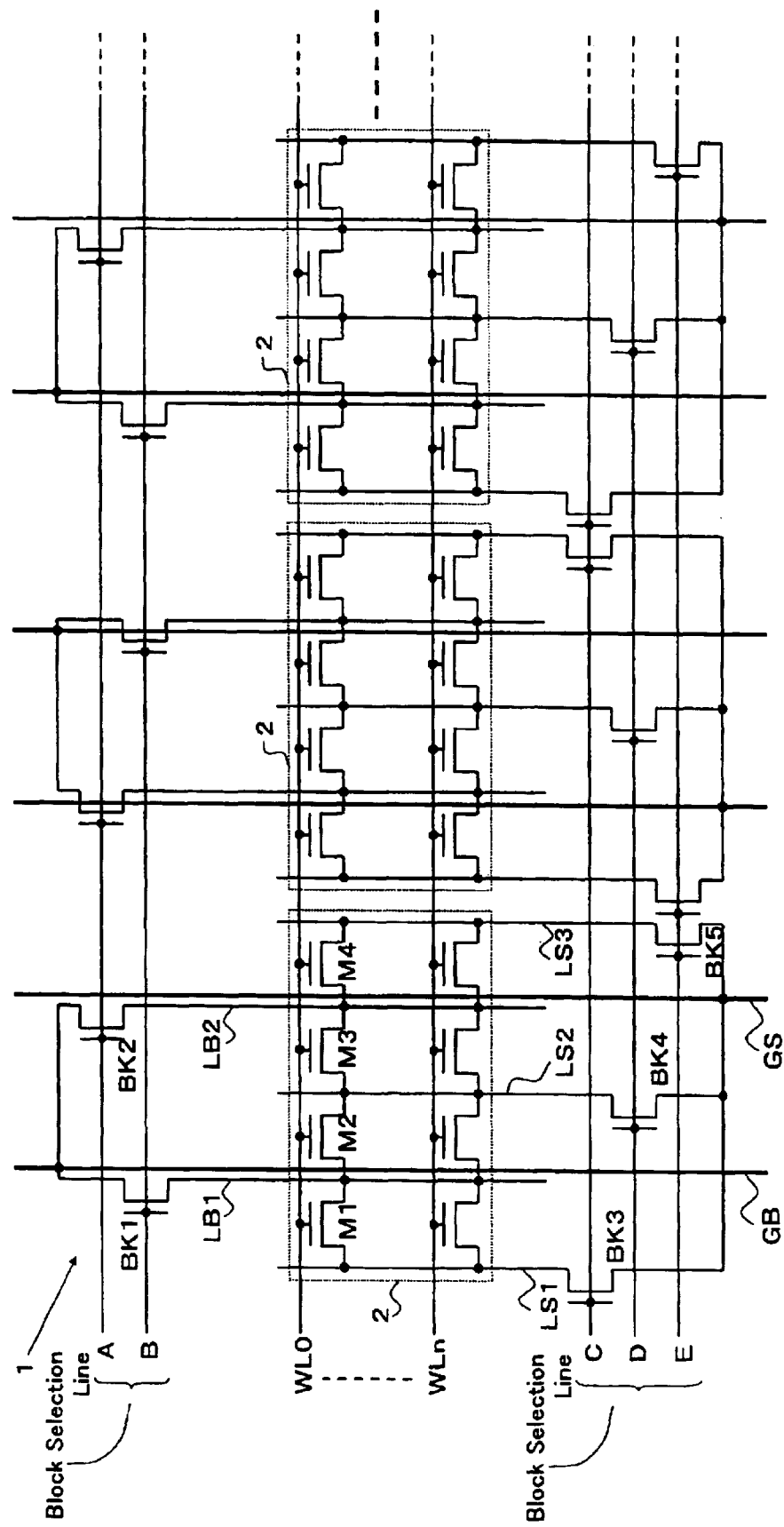
FIG. 1 is an essential-portion circuit diagram showing a first embodiment of a memory cell array configuration of a semiconductor memory device of the present invention.
Figure 2:
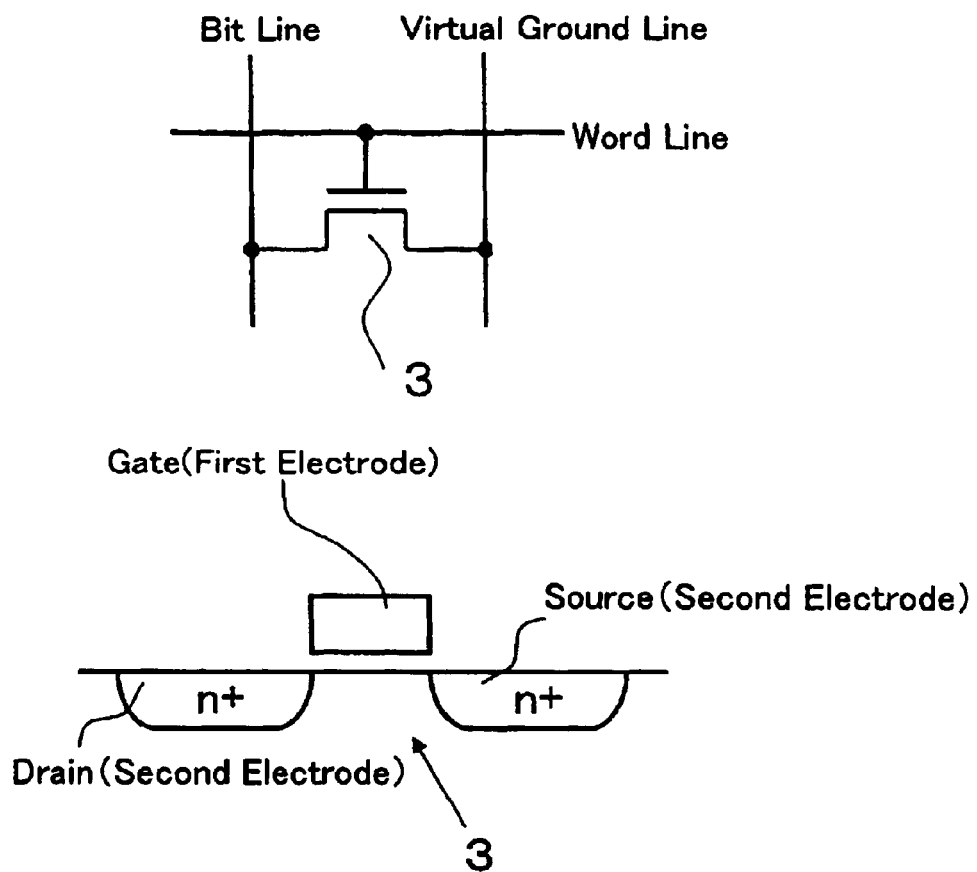
FIG. 2 is an illustration showing an equivalent circuit diagram and a schematic sectional view of a memory cell of a mask ROM.

FIG. 1 is an essential-portion circuit diagram showing a first embodiment of a memory cell array configuration 1 of the present invention device. Because this embodiment has a technical content relating to a data reading operation, a memory cell of a mask ROM constituted by one transistor and having a simple memory cell structure is described. A memory cell generally has one first electrode and a pair of second electrodes and a configuration capable of reading stored contents in accordance with the state of electrical connection between the second electrodes correspondingly to the potential of the first electrode. In the case of the above mask-ROM memory cell, as shown in FIG. 2, the gate electrode of an n-channel MOSFET constituting a memory cell transistor 3 correspond to the first electrode and the drain and source electrodes of the MOSFET correspond to the second electrodes respectively. The state of electrical connection between the second electrodes is decided by the threshold voltage of the MOSFET and the threshold voltage is set in accordance with programmed data in the fabrication stage. The reading operation and data storing method of a single memory cell are the same as the contents described in the section of Description of the Related Art. Therefore, duplicate description is omitted and the same term is similarly used.

As shown in FIG. 1, a memory cell array 1 is constituted so that a plurality of memory cells is arranged like a matrix in the row direction (word-line extending direction) and the column direction (bit-line extending direction) and moreover, divided into a plurality of subarrays 2 in the row direction by a device isolation zone formed along the column direction every four cells. Each subarray 2 has a memory cell arrangement of (n+1) rows×4 columns.

In the case of each subarray 2, each gate electrode of a memory cell transistor (hereafter properly referred to as memory cell) is connected to a common word line WLi (i=0 to n), source electrodes and drain electrodes are respectively connected each other between two adjacent memory cells in the row direction, drain electrodes of the memory cells in the same column are connected to a common bit line LBj (j=1,2), and source electrodes are connected to a common virtual ground line LSk (k=1,2,3). When assuming the row direction as a horizontal direction, memory cells in the first column and second column and memory cells in the third column and fourth column from the left respectively share a bit line by adjacent sides and the memory cells in the second column and third column respectively share a virtual ground line by adjacent sides. The memory cells in the first column and fourth column are connected to an independent virtual ground line because a source electrode is isolated from the next subarray by a device isolation zone. This embodiment uses the hierarchical bit line system described in the section of Description of Related Art. When referring to a line merely as a bit line or virtual ground line in the following description, the line denotes an auxiliary bit line (local bit line) or an auxiliary virtual ground line (local virtual ground line).

Each subarray 2 has one global bit line GB and one global virtual ground line GS, two bit lines LB1 and LB2 are connected to the global bit line GB through first selection transistors BK1 and BK2, three virtual ground lines LS1, LS2, and LS3 are connected to the global virtual ground line GS through second selection transistors BK3, BK4, and BK5. The first selection transistors BK1 and BK2 are collectively arranged at one end of the subarray 2 in the column direction and the second selection transistors BK3, BK4, and BK5 are collectively arranged at the other end of the subarray 2 in the column direction, and word lines WL0 to WOn are arranged between block selection lines A and B for controlling gate electrodes of the first selection transistors BK1 and BK2 respectively and block selection lines C, D, and E for controlling gate electrodes of the second selection transistors BK3, BK4, and BK5 respectively.

Then, operations for selecting the left-end object of the subarray 2 shown in FIG. 1 and for reading data from memory cells M1 to M4 are described below.

First, when reading data from the memory cell M1, the word line WL0 is selectively set to the high level in order to select the memory cell M1 in the row direction. Then, to select the memory cell M1 on the column direction, the bit line LB1 and virtual ground line LS1 to be connected to the memory cell M1 are selected. The bit line LB1 and virtual ground line LS1 are selected by selecting the global bit line GB and a global virtual ground line GS as objects from which data will be read, setting the block selection lines B and C to the high level, turning on the first selection transistor BK1 and second selection transistor BK3, and connecting the bit line LB1 and virtual ground line LS1 to the global bit line GB and global virtual ground line GS through the first selection transistor BK1 and the second selection transistor BK3 respectively.

Moreover, the block selection line A is set to the high level and the first selection transistor BK2 is turned on in addition to the above state. By charging the global bit line GB to a predetermined charging potential from a charging circuit (not shown) under the above state and setting the global virtual ground line GS to the ground potential, the bit lines LB1 and LB2 are charged and the virtual ground line LS1 becomes the ground potential. As a result, the gate electrode of the memory cell M1 from which data will be read is set to the high level and a charging potential is applied to the drain electrode of the memory cell M1 and the ground potential is applied to the source electrode of M1. Moreover, the charging potential is simultaneously applied to the bit line LB2.

Because whether the charging potential of the bit line LB1 lowers or not is decided depending on whether the memory cell M1 is an on-transistor (low threshold voltage) or an off-transistor (high threshold voltage), the memory cell M1 is read by sensing a potential change of the global bit line GB following a potential change of the bit line LB1 by a sensing circuit (not shown). In this case, when the potential change amplitude of the bit line LB1 decreases, a reading operation margin decreases and a reading speed lowers.

Figure 9:
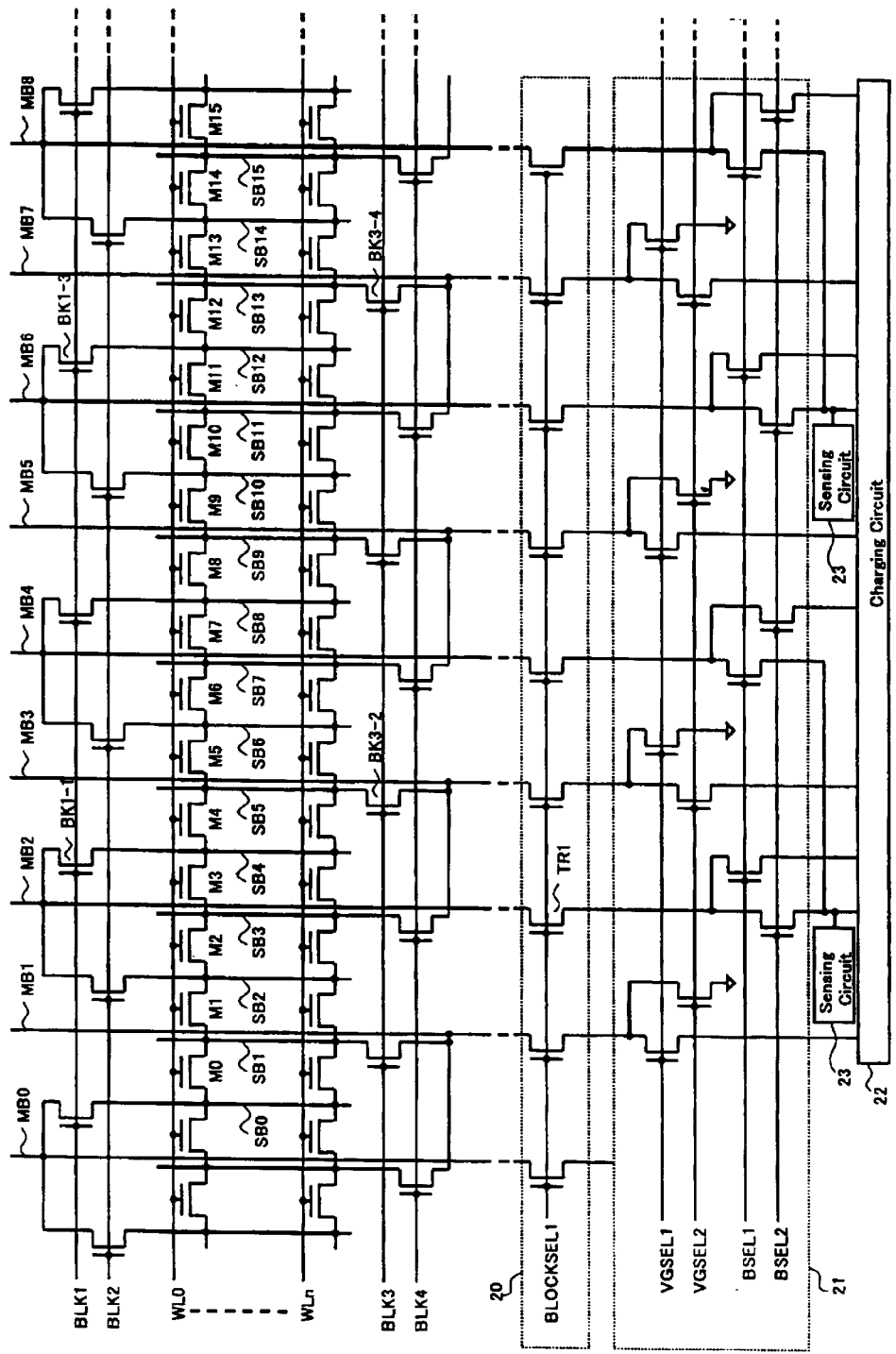
FIG. 9 is an essential-portion circuit diagram showing a memory cell array configuration using a hierarchical bit line system of a conventional semiconductor memory device.

Charging the above bit line LB2 works to prevent the alternate discharge current described in the section of Description of the Related Art, which becomes a problem when the memory cell M1 is off-transistor and the unselected memory cells M2 to M4 are on-transistors. In the case of the conventional memory cell array configuration (conventional example) shown in FIG. 9, when the memory cell M1 from which data will be read is an on-transistor, the alternate injection current described in the section of Problems to Be Solved by the Invention is generated due to the charging for preventing the alternate discharge current to cause the reading operation margin of the memory cell M1 to decrease.

However, in the case of this embodiment, when the memory cell M1 is an on-transistor, that is, when the charging potential of the bit line LB1 lowers, the potential of the global bit line GB also lowers and moreover, the potential of the bit line LB2 lowers by following the above potentials through the first selection transistor BK2. Therefore, an alternate injection current is avoided from being generated and thus, a reading operation margin does not decrease.

Then, a case of reading data from the memory cell M2 is described below. The word line WL0 is selectively set to the high level in order to select the memory cell M2 in the row direction. Then, the bit line LB1 and virtual ground line LS2 to be connected to the memory cell M2 are selected in order to the memory cell M2 in the column direction. The bit line LB1 and virtual ground line LS2 are selected by selecting the global bit line GB and global virtual ground line GS as objects from which data will be read, setting the block selection lines B and D to the high level, turning on the first selection transistor BK1 and second selection transistor BK4, and connecting the bit line LB1 and virtual ground line LS2 to the global bit line GB and global virtual ground line GS through the first selection transistor BK1 and second selection transistor BK4 respectively.

Under the above state, by charging the global bit line GB up to a predetermined potential from a charging circuit (not shown) and setting the global virtual ground line GS to the ground potential, the bit line LB1 is charged and the virtual ground line LS2 becomes the ground potential. As a result, the gate electrode of the memory cell M2 from which data will be read is set to the high level, the charging potential is applied to the drain electrode of M2 and the ground potential is applied to the source electrode of M2. The reading operation of the memory cell M2 is the same as that of the memory cell M1.

In this case, the alternate discharge current becomes a problem when the next memory cell M1 is an on-transistor. However, the alternate discharge current is not generated any more when charging the virtual ground line LS1 is completed through the memory cell M1 because the memory cell M1 is electrically completely isolated from the next subarray by a device isolation zone at the opposite side of the memory cell M2. Moreover, when the memory cell M2 is selected as an object from which data will be read, no alternate injection current is generated because the bit line LB2 to be connected only to an unselected memory cell is not charged. Therefore, also when the memory cell M2 is an object from which data will be read, a reading operation margin does not decrease. In this case, even if setting the block selection line E to the high level, turning on the second selection transistor BK5, and connecting the virtual ground line LS3 to the global virtual ground line GS through the second selection transistor BK5, the memory cell M2 does not affect a reading operation. If the bit line LB2 and virtual ground line LS3 are charged for any reason, charged states of the bit line LB2 and virtual ground line LS3 may affect the case of setting the selected virtual ground line LS2 to the ground potential when the memory cells M3 and M4 are on-transistors. Therefore, the effect capable of preventing the above problem can be expected by turning on the second selection transistor BK5 and setting the virtual ground line LS3 to the ground potential.

Then, the case of reading data from the memory cell M3 is described below. The word line WL0 is selectively set to the high level in order to select the memory cell M3 in the row direction. Then, the bit line LB2 and virtual ground line LS2 to be connected to the memory cell M3 are selected in order to select the memory cell M3 in the column direction. The bit line LB2 and virtual ground line LS2 are selected by selecting the global bit line GB and global virtual ground line GS as objects from which data will be read, setting the block selection lines A and D to the high level, turning on the first selection transistor BK2 and second selection transistor BK4, and connecting the bit line LB2 and virtual ground line LS2 to the global bit line GB and global virtual ground line GS through the first selection transistor BK2 and second selection transistor BK4 respectively. In this case, it is also preferable to set the block selection line C to the high level and turn on the second selection transistor BK3 also in the reading operation of the memory cell M3 because of the reason same as the case of setting the block selection line E to the high level and turning on the second selection transistor BK5 when reading data from the memory cell M2.

Because the memory cells M3 and M2 are bilaterally symmetrical to the virtual ground line LS2 in the subarray 2, reading data from the memory cell M3 is the same as the case of reading data from the memory cell M2 except only the fact that reading data from the memory cell M2 and a bit line to be selected are different. Therefore, descriptions of a reading operation and reading operation margin are omitted.

It is preferable to set the block selection line C to the high level and turn on the bilaterally-symmetrical second selection transistor BK3 also when reading data from the memory cell M3 the same as the case of setting the block selection line E to the high level and turning on the second selection transistor BK5 when reading data from the memory cell M2.

Then, the case of reading data from the memory cell M4 is described below. The word line WL0 is set to the high level in order to select the memory cell M4 in the row direction. Then, the bit line LB2 and virtual ground line LS3 to be connected to the memory cell M4 are selected in order to select the memory cell 4 in the column direction. The bit line LB2 and virtual ground line LS3 are selected by selecting the global bit line GB and global virtual ground line GS as objects from which data will be read, setting the block selection lines A and E to the high level, turning on the first selection transistor BK2 and second selection transistor BK5, and connecting the bit line LB2 and virtual ground line LS3 to the global bit line GB and global virtual ground line GS through the first selection transistor BK2 and second selection transistor BK4 respectively. Moreover, in addition to the above state, the block selection line B is set to the high level and the first selection transistor BK1 is turned on.

Because the memory cells M4 and M1 are bilaterally symmetrical to the virtual ground line LS2 in the subarray 2, reading data from the memory cell M4 is the same as the case of reading data from the memory cell M1 except only the fact that a bit line to be selected, and virtual ground line are different. Therefore, descriptions of a reading operation and reading operation margin are omitted.

Reading data from the memory cells M1 to M4 is described above in accordance with FIG. 1. When reading data from the memory cells M1 and M4, that is, when reading data from memory cells at the both ends of the subarray 2, an operation margin is prevented from decreasing by also charging an unselected bit line (bit line connecting with only an unselected memory cell). Moreover, when reading data from the memory cells M2 and M3, that is, when reading data from memory cells of two columns at the center of the subarray 2, an operation margin is prevented from decreasing without charging unselected bit lines. In other words, it is determined whether to charge an unselected bit line in accordance with the position of a memory cell from which data will be read in the subarray 2.

Furthermore, when reading data from the memory cells M2 and M3, a corresponding second selection transistor is turned on in order to set a virtual ground line farther from a memory cell from which data will be read among unselected virtual ground lines (virtual ground lines connecting with only an unselected memory cell) to the ground potential. As a result, even when reading data from any memory cell, three selection transistors including one first selection transistor and one second selection transistor among two first selection transistors and three second selection transistors are turned on. Thus, it is possible to simplify control logics of the first and second selection transistors.

Then, the timing of the charging by the above charging circuit is described below. When assuming that a period after a selected word line is changed to the high level is a reading operation period, it is allowed to perform the above charging during a charging period which starts before the reading operation period and ends before or after the start of the reading operation period. Moreover, it is allowed to perform the above charging during the reading operation period without setting the charging period or during both the charging period and reading operation period.

Moreover, about the layouts of bit lines and the virtual ground lines in the subarray 2, it is allowed to replace both layouts. That is, it is allowed to assume two bit lines LB1 and LB2 as two virtual ground lines LS1 and LS2, three virtual ground lines LS1, LS2, and LS3 as three bit lines LB1, LB2, and LB3, and first selection transistors BK1 and BK2 as second selection transistors and connect them to the global virtual ground line GS, assume the second selection transistors BK3, BK4 and BK5 as first selection transistors and connect them to the global bit line GB. Thereby, the global bit line GB is replaced with the global virtual ground line GS without changing the physical connection between a transistor and each control signal line. However, it is necessary to physically change the connection with peripheral circuits such as a charging circuit and sensing circuit to be connected with the global bit line GB and global virtual ground line GS. A reading operation is basically the same as the case of the configuration shown in FIG. 1 and it is allowed to decide charging an unselected bit line for preventing an alternate discharge current in accordance with the same concept.

(Second Embodiment)

Figure 3:
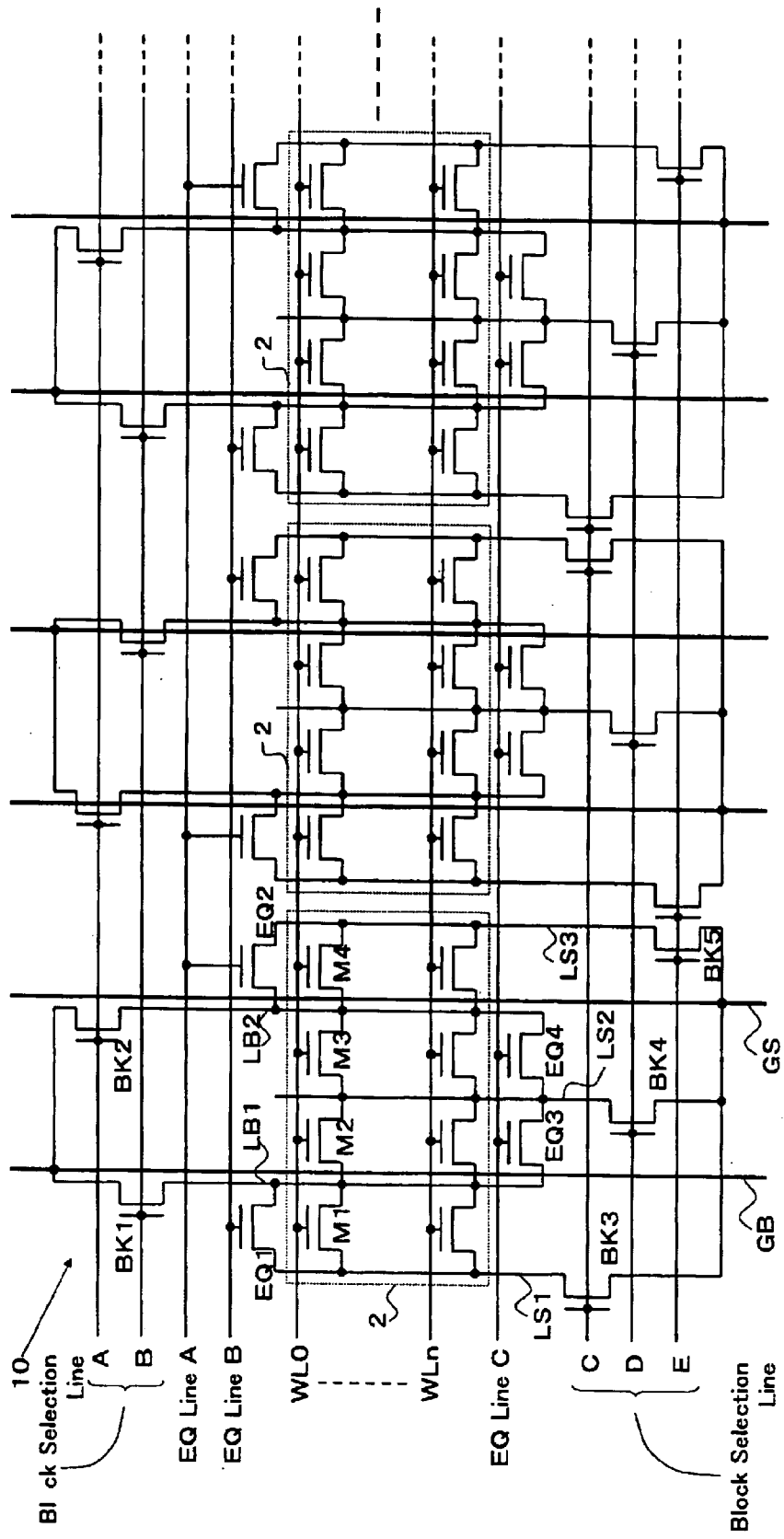
FIG. 3 is a circuit diagram of an essential portion showing a second embodiment of a memory cell array configuration of a semiconductor memory device of the present invention.

FIG. 3 is an essential-portion circuit diagram showing a second embodiment of a configuration of a memory cell array 10 of the present invention device. The circuit diagram is described by using a memory cell of a mask ROM the same as the case of the first embodiment. The configuration in which the memory array 10 is divided into a plurality of subarrays 2 is the same as the case of the first embodiment and the configuration of the subarray 2 is completely the same as the case of the first embodiment. Specific modes of a hierarchical bit line system and first selection transistors BK1 and BK2 and second selection transistors BK3, BK4 and BK5 are also the same as the case of the first embodiment.

The second embodiment is different from the first embodiment in that four switching transistors EQ1 to EQ4 for electrically connecting two bit lines LB1 and LB2 with three virtual ground lines LS1, LS2, and LS3 are set between those adjacent to each other. Specifically, the switching transistor EQ1 is set between the virtual ground line LS1 and bit line LB1, the switching transistor EQ2 is set between the virtual ground line LS3 and bit line LB2, the switching transistor EQ3 is set between the virtual ground line LS2 and bit line LB1, and the switching transistor EQ4 is set between the virtual ground line LS2 and bit line LB2. The gate electrode of the switching transistor EQ1 is controlled by an EQ line B, the gate electrode of the switching transistor EQ2 is controlled by an EQ line A, and gate electrodes of the switching transistors EQ3 and EQ4 are controlled by an EQ line C. Three control signal EQ lines A TO C are used for the four switching transistors EQ1 to EQ4.

Then, operations for selecting the left-end object of the subarray 2 shown in FIG. 3 and reading data from memory cells M1 to M4 are described below. Because the basic operation for data reading is the same as the case of the first embodiment, a duplicate description is properly omitted.

First, a case of reading data from the memory cell M1 is described below. Selection of the memory cell M1 is the same as the case of the first embodiment and the fact that the first selection transistors BK1 and BK2 and the second selection transistors BK3 are set so as to be turned on is also the same. Hereafter, the control of the switching transistors EQ1 to EQ4, which is peculiar to the second embodiment is mainly described below.

The EQ lines A and C are set to the high level simultaneously with the control of the first selection transistors BK1 and BK2 and second selection transistor BK3 to turn on the switching transistors EQ2 to EQ4. As a result, in the case of the first embodiment, the virtual ground lines LS2 and LS3 are charged via the switching transistors EQ2 to EQ4 though they are charged via on-transistors when the memory cells M3 and M4 are the on-transistors. That is, in the case of this embodiment, charging bit lines is also applied to unselected virtual ground lines (virtual ground lines to be connected only to unselected memory cells) via the switching transistors EQ2 to EQ4 independently of storage states of the memory cells M3 and M4 or the potential level of a selected word line. Therefore, an alternate discharge current is more effectively restrained compared to the case of the first embodiment.

Moreover, the alternate discharge current does not cause a reading operation margin or reading operation speed to decrease because the above charging to unselected bit lines and virtual ground lines is performed from the global bit line GB the same as the case of the first embodiment.

Then, a case of reading data from the memory cell M2 is described below. Selection of the memory cell M2 is the same as the case of the first embodiment also on the point of setting the block selection lines B and D or B, D, and E to the high level and turning on the first selection transistor BK1 and second selection transistor BK4 or BK4 and BK5. The control of the switching transistors EQ1 to EQ4, which is peculiar to the second embodiment is mainly described below.

The EQ line B is set to the high level and the switching transistor EQ1 is turned on simultaneously with the control of the first selection transistor BK1 and second selection transistor BK4 or the transistors BK4 and BK5. Thereby, the unselected virtual ground line LS1 is also charged to the charging potential of the bit line LB1 through the switching transistor EQ1 and this charging more effectively prevents an alternate discharge current.

It is also allowed to set the EQ line A to the high level simultaneously with the EQ line B. This is because the selected virtual ground line LS2 is lowered to the ground potential, a charging operation or reading operation is not influenced even if the switching transistor EQ2 is turned on and the potential of the unselected bit line LB2 is lowered. Thereby, two EQ lines are set to the high level the same as the case of reading data from the memory cell M1 and it is possible to simplify control logics of the EQ lines.

Then, the case of reading data from the memory cell M3 is described. Selection of the memory cell M3 is the same as the case of the first embodiment. Moreover, the point of setting the block selection lines A and D or A, D, and C to the high level and turning on the first selection transistor BK2 and second selection transistor BK4 or the transistors BK4 and BK3 is the same as the case of the first embodiment. In the case of the reading operation of the memory cell M3, the EQ line A is set to the high level to turn on the switching transistor EQ2 simultaneously with the control of the above block selection lines. Thereby, the virtual ground line LS3 is also charged to the charging potential of the bit line LB2 through the switching transistor EQ2 and this charging more effectively prevents an alternate discharge current. Moreover, it is allowed to set the EQ line B to the high level simultaneously with the EQ line A because of the same reason as the case of reading data from the memory cell M2.

Then, the case of reading data from the memory cell M4 is described below. Selection of the memory cell M4 is the same as the case of the first embodiment and the point in which the first selection transistors BK1 and BK2 and second selection transistor BK5 are set to the turned-on state is also the same as the case of the first embodiment. The EQ lines B and C are set to the high level to turn on the switching transistors EQ1, EQ3, and EQ4 simultaneously with the control of the first selection transistors BK1 and BK2 and second selection transistor BK5. As a result, the virtual ground lines LS1 and LS2 are charged via the switching transistors EQ1, EQ3, and EQ4 though they are charged via on-transistors when the M1 and M2 are the on-transistors in the case of the first embodiment and thereby, an alternate discharge current is effectively restrained. This point is the same as reading data from the memory cell M1 which is bilaterally symmetrical to the virtual ground line LS2. Moreover, the alternate injection current does not cause a reading operation margin or reading operation speed to decrease because charging unselected bit lines and virtual ground lines is the charging from the same global bit line GB.

Reading data from the memory cells M1 to M4 is described above in accordance with FIG. 3. In the case of reading data from the memory cells M1 and M4, that is, in the case of reading data from memory cells at the right and left ends of the subarray 2, an operation margin is prevented from decreasing by also charging unselected bit lines and virtual ground lines. Moreover, in the case of reading data from the memory cells M2 and M3, that is, in the case of reading memory cells in two central columns of the subarray 2, an operation margin is prevented from decreasing by charging unselected virtual ground lines through a switching transistor instead of charging unselected bit lines. In other words, it is determined to charge an unselected bit line or unselected virtual ground line in accordance with the position of a memory cell from which data will be read in the subarray 2.

As described above, by adding the switching transistors EQ1 to EQ4, it is possible to more securely prevent an alternate discharge current, restrain the decrease of a reading operation margin, and realize a high-speed reading operation. Moreover, it is allowed to execute the control of selectively turning on the switching transistors EQ1 to EQ4 during the charging period, reading operation period, or during the both period as described for the first embodiment.

Figure 4:
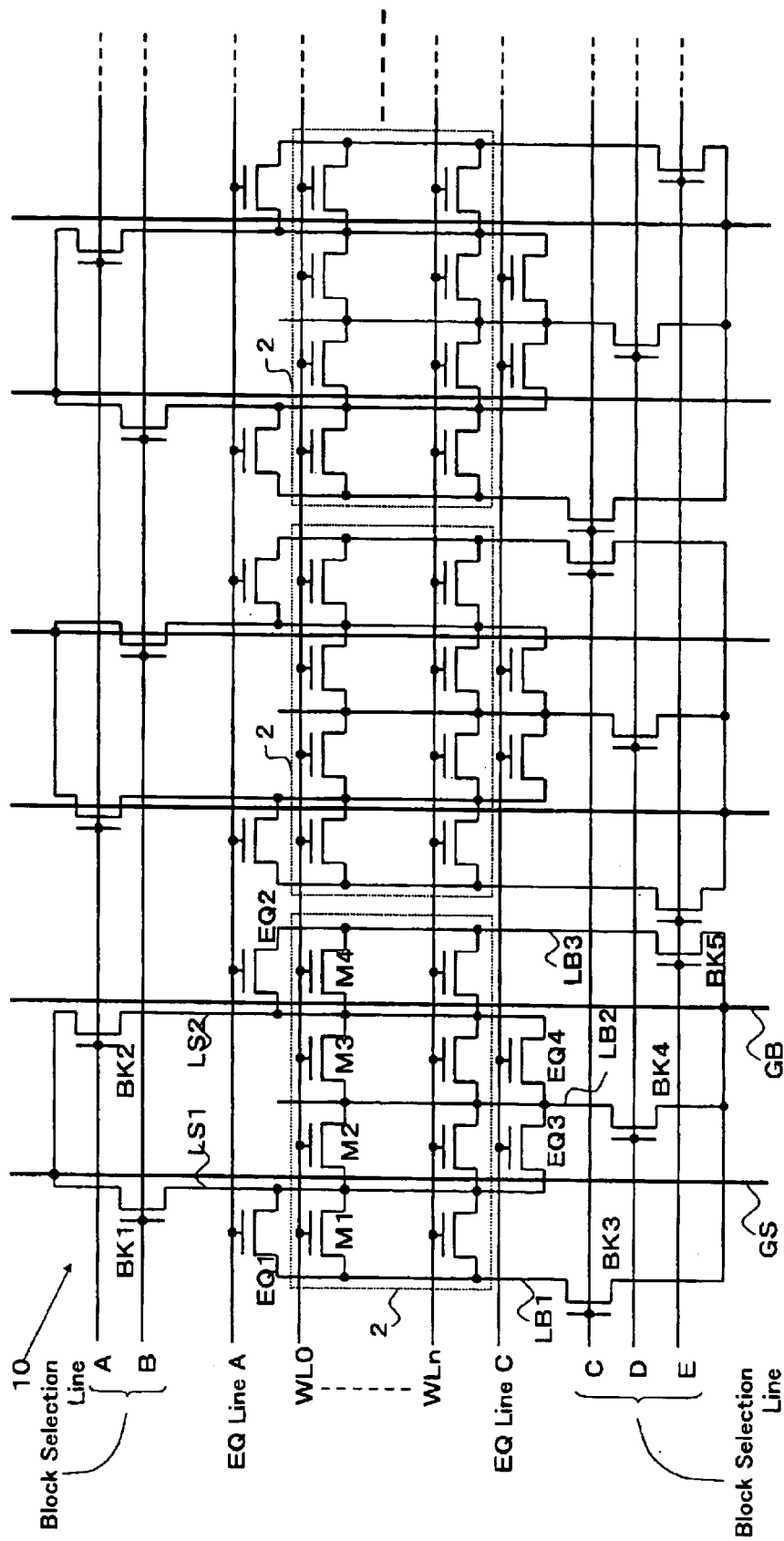
FIG. 4 is an essential-portion circuit diagram showing an embodiment when replacing a bit line with a virtual ground line in a memory cell array configuration of a second embodiment of a semiconductor memory device of the present invention.

Also in the case of the second embodiment, it is possible to replace the array of bit lines with that of virtual ground lines and the global bit line GB with the global virtual ground line GS in the subarray 2 the same as the case of the first embodiment. FIG. 4 shows a circuit configuration in which bit lines are replaced with virtual ground lines. In the case of the first embodiment, a physical change of the connection between a transistor and each control signal is unnecessary. In the case of the second embodiment, however, connections between the switching transistors EQ1 to EQ4 and their control signal EQ lines A to C are changed. Specifically, the EQ line B is unnecessary and the gate electrode of the switching transistor EQ1 is controlled by the EQ line A.

As shown in FIG. 4, for the configuration of the subarray 2 shown in FIG. 3, the global line GB is replaced with the global virtual ground line GS by replacing the array of bit lines with that of virtual ground lines the same as the case of the first embodiment. Contrary, by replacing the global bit line GB with the global virtual ground line GS, the array of bit lines and that of virtual ground lines of the subarray 2 are replaced with each other. Because a reading operation is basically the same as the case of the configuration shown in FIG. 3, it is allowed to decide the control of the block selection lines A to E and switching transistors EQ1 to EQ4 for charging unselected bit lines and virtual ground lines according to the same concept.

(Third Embodiment)

Figure 5:
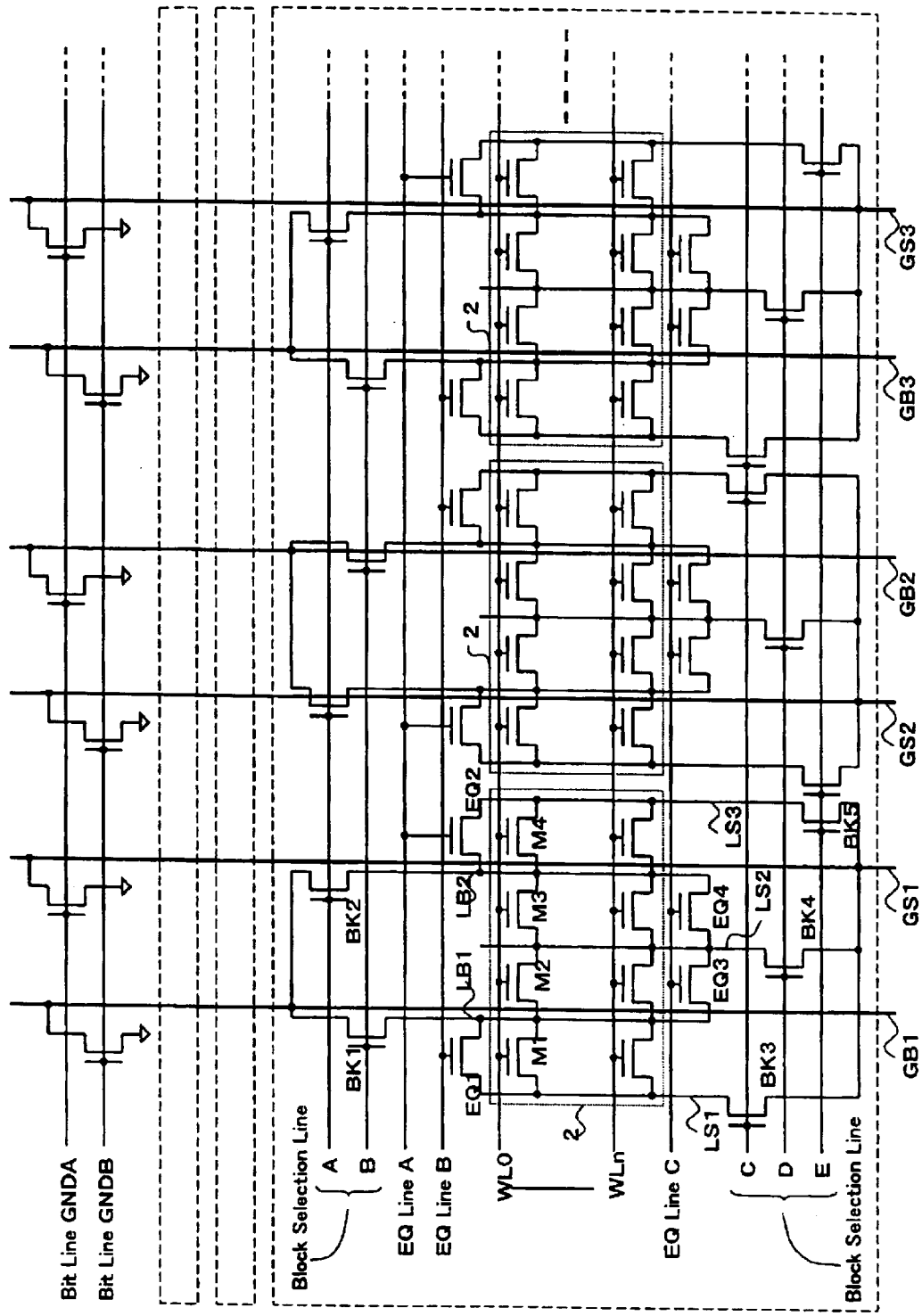
FIG. 5 is an essential-portion circuit diagram showing a third embodiment of a semiconductor memory device of the present invention.

FIG. 5 is an essential-portion circuit diagram showing a third embodiment of the present invention. The third embodiment is constituted by adding a circuit for executing the short check (short-circuit test) between adjacent bit lines or adjacent virtual ground lines, which is performed in the fabrication process of a global bit line and global virtual ground line or a bit line and virtual ground line. By using the circuit configuration shown in FIG. 5, it is possible to execute not only the short check of a global bit line or global virtual ground line but also the short check of a bit line and virtual ground line. Operations of the short check in this embodiment are described below.

To execute the short check of a global bit line and global virtual ground line (each of these lines is hereafter properly referred to as a global line), the bit-line GNDA signal in FIG. 5 is set to the high level and the bit-line GNDB signal in FIG. 5 is set to the low level. As a result, a global bit line GB2 and global virtual ground lines GS1 and GS3 respectively have the ground potential. Under the above state, each block selection line, all word lines, and all EQ lines are set to the low level. Moreover, a global virtual ground line GS2 is set to the VCC level (power supply potential) to measure the current flowing through the global virtual ground line GS2. When a short with the adjacent global virtual ground line GS1 or global bit line GB2 occurs, a current flows through a transistor using the bit-line GNDA signal as a gate signal. However, when a short does not occur, a flowing current becomes the leakage current of a junction (unction portion of a diffusion layer) of a first or second selection transistor and the adjacent short check of a global line can be executed in accordance with the difference between orders of flowing current values depending presence or absence of a short. It is possible to execute the short check of all global line by the same method.

Then, an example of the short check of a bit line or virtual ground line (each of them is hereafter properly referred, to as bit line or the like) is described below. The case of the short check of the virtual ground line LS3 is described. After the short check of a global line is completed, the bit-line GNDA signal in FIG. 5 is set to the low level to apply the VCC level to the global virtual ground line GS1 from the outside. Then, the bit-line GNDB signal in FIG. 5 is set to the high level so that the global bit line GB1 and global virtual ground line GS2 becomes the ground potential. Under the above state, the block selection lines A and E are set to the high level. Other block selection lines all word lines, and all EQ lines are set to the low level. Under the above state, the current flowing through the global virtual ground line GS1 is measured. The bit line LB2 and virtual ground line LS4 become the ground potential and the virtual ground line LS3 becomes the VCC level. Therefore, when the virtual ground line LS3 shorts with the bit line LB2 or virtual ground line LS4, a short current flows. It is possible to execute the short check of all bit lines in accordance with the same concept.

In the case of the circuit example in FIG. 5, a transistor to be pulled down to the ground potential is connected to only a global line. However, it is also allowed to add a transistor for pulling down a bit line for checking a short every local bit line. In this case, it is possible to execute the short check of a global line and the short check of a bit line or the like in random order.

(Other Embodiment)

Then, an embodiment other than the above embodiments is described below.

Figure 6:
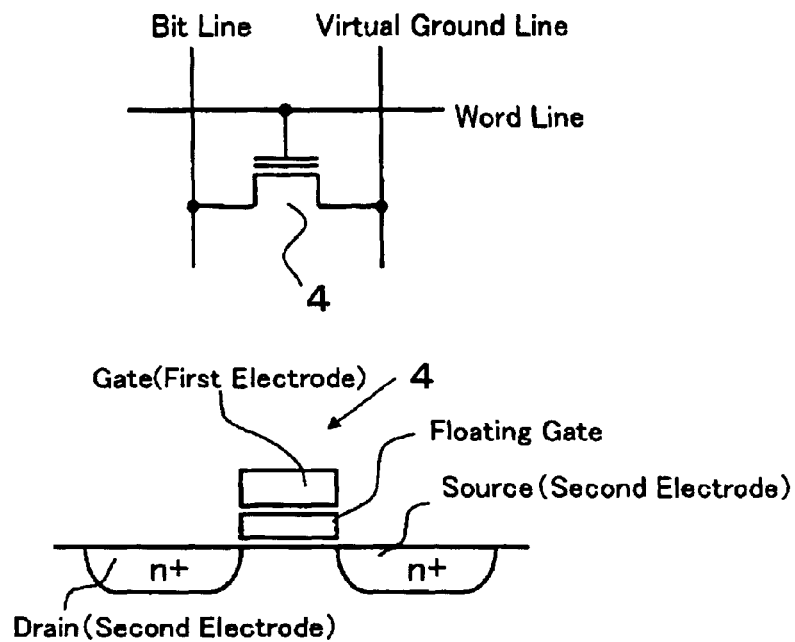
FIG. 6 is an illustration showing an equivalent circuit diagram and a schematic sectional view of a memory cell using a flash memory device.
Figure 7:
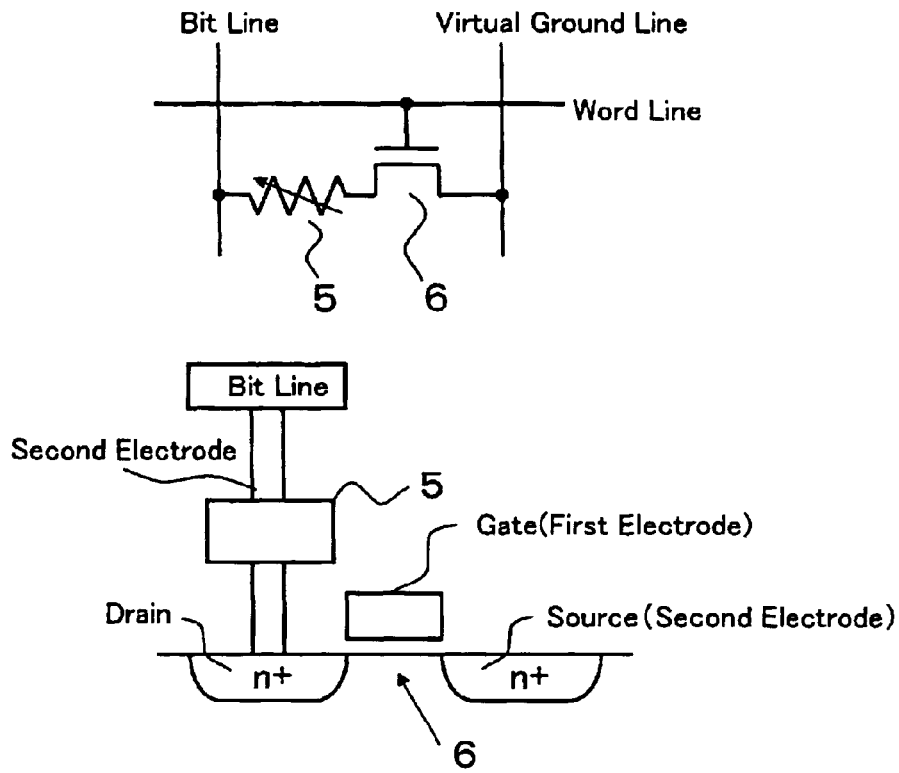
FIG. 7 is an illustration showing an equivalent circuit diagram and a schematic sectional view of a memory cell using a variable-resistance element.
Figure 8:
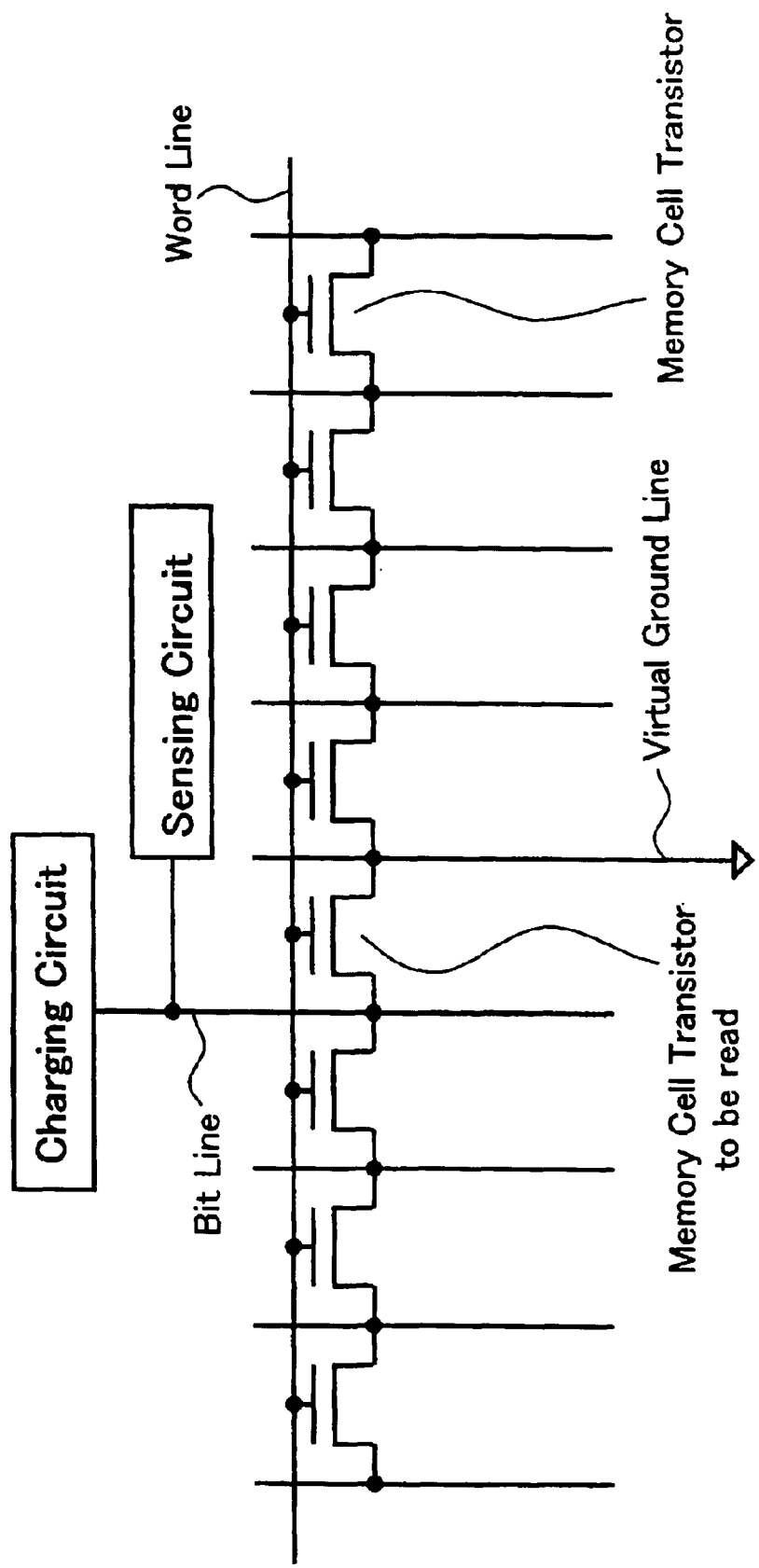
FIG. 8 is a conceptual view of a reading system using a virtual ground line.

Each of the above embodiments uses a memory cell of a mask ROM as a memory cell. However, it is also allowed to use a memory cell using a flash memory device or variable resistance device. FIGS. 6 and 7 show equivalent circuit diagrams and typical sectional views of memory cells when using each element as a memory cell. In any case, a first electrode and a pair of second electrodes are used so that stored contents can be read in accordance with the state of electrical connection between the second electrodes correspondingly to the potential of the first electrode.

As shown in FIG. 6, in the case of a memory cell using a flash memory device 4, the gate electrode of a MOSFET of a floating gate structure constituting a memory cell transistor corresponds to the first electrode, and the drain and source electrodes of the MOSFET correspond to the second electrodes respectively. The storage state of the memory cell is changed by transferring electrons to and from the floating gate and thereby controlling the threshold voltage of the memory cell transistor. It is allowed to control the threshold voltage by using the publicly-known programming-erasing technique of a flash memory.

As shown in FIG. 7, when a memory cell using the variable resistance device 5 is used, one end of the variable resistance device 5 is connected with the drain electrode of a selection transistor 6 constituted by an n-channel MOSFET for selecting a memory cell, the gate electrode of the selection transistor 6 is used as a first electrode and the other end of the variable resistance device 5 and the source electrode of the selection transistor 6 are respectively used as a second electrode, and the second electrode at the variable resistance device 5 is connected to a bit line and the second electrode at the selection transistor 6 is connected to a virtual ground line. Change of the storage state of the memory cell is performed by changing the resistance value of the variable resistance device 5 in accordance with external control. The following various variable resistance devices are proposed: a variable resistance device for performing the external control in accordance with an electrical stress, a variable resistance device for performing the external control in accordance with a magnetic stress, and a variable resistance device for performing the external control in accordance with a thermal stress.

For example, an RRAM (Resistance control nonvolatile Random Access Memory) device is used as a variable resistance device whose resistance value is changed in accordance with an electrical stress (such as voltage pulse). The RRAM device is a nonvolatile memory device capable of storing data in accordance with the change of an electrical resistance because the electrical resistance is changed when an electrical stress is applied and a changed electrical resistance is kept after the electrical stress is canceled, which is fabricated by forming a manganese oxide film of any one of substances shown by $Pr_{(1-x)}Ca_xMnO_3$, $La_{(1-x)}Ca_xMnO_3$, and $La_{(1-x-y)}Ca_xPb_yMnO_3$ (in this case, x<1, y<1, and x+y<1) such as $Pr_{0.7}Ca_{0.3}MnO_3$, $La_{0.65}Ca_{0.35}MnO_3$, and $La_{0.65}Ca_{0.175}Pb_{0.175}MnO_3$ in accordance with the MOCVD method, spin coating method, laser abrasion, or sputtering method. Moreover, it is possible to control a resistance change value of the RRAM device by applying a voltage pulse between electrodes of the RRAM device as an electrical stress and adjusting either or both of the pulse width and voltage amplitude.

A memory cell from which data will be read by the present invention is a memory cell having one first electrode and a pair of second electrodes and capable of reading stored contents in accordance with the state of electrical connection between the second electrodes correspondingly to the potential of the first electrode. In the case of each of the above embodiments and other embodiment, one of the two electrodes is fixedly connected to a bit line and the other of them is fixedly connected to a virtual ground line. This is because a memory cell transistor has a structure in which the drain electrode and the source electrode are symmetric, a bit line and a virtual ground line are not functionally changed even if replacing them with each other because it is enough to fix either of the electrodes to the drain electrode and specify a one-directional reading current or it is necessary to fix one of the second electrodes to a bit line and the other of them to a virtual ground line because a memory cell has an asymmetric structure between the second electrodes.

However, the configuration of a memory cell array of each of the above embodiments can be also used for a memory cell using a multi-bit memory device capable of independently supplying a reading current bidirectionally and the same advantage as that of each of the embodiments. For example, in the case of a memory cell capable of storing two-bit data, when a current flow direction differs whenever reading each one-bit data, it is possible to separately read two-bit data one bit by one bit by properly alternating a bit line and a virtual ground line. Also in the case of a multi-valued memory cell suitable for increasing the memory cell array in capacity, problems of the above alternate discharge current and alternate injection current similarly occur. According to the present invention, however, it is possible to avoid erroneous reading and decrease of an operation margin by excluding influences of these problems.

An embodiment constituted by using a sidewall memory device is described below as a memory cell capable of storing two-bit data.

Figure 10:
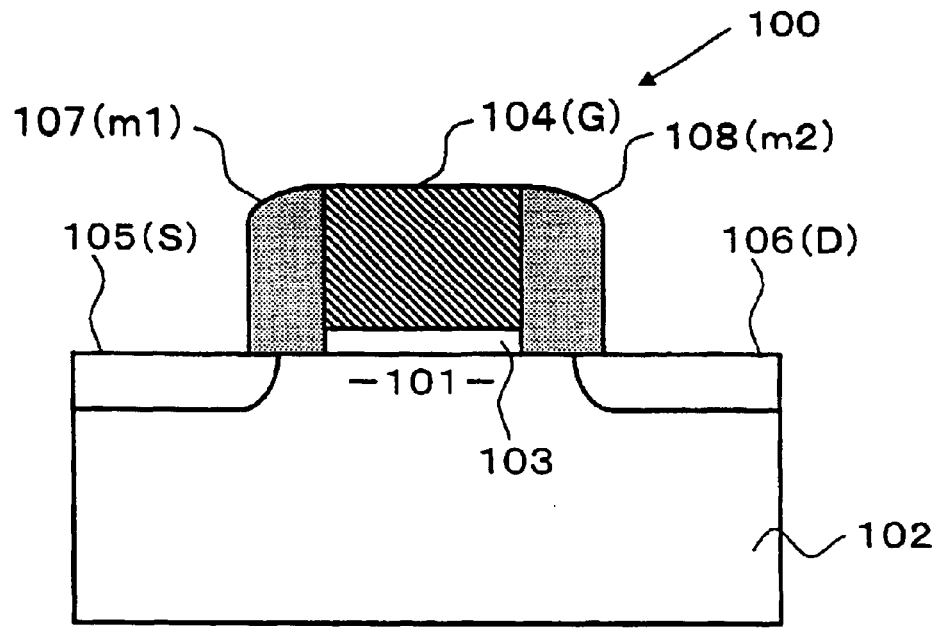
FIGS. 10A and 10B are a schematic sectional view and an equivalent circuit diagram of a side-wall memory device.
Figure 10:
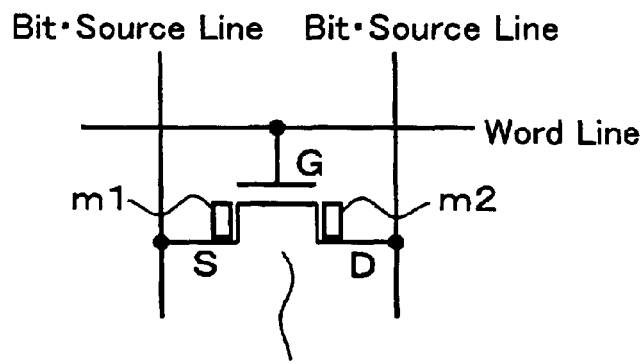

First, the structure of the sidewall memory device is briefly described below. A sidewall memory device is described in detail in the international publication booklet (international publication number: WO03/044868) of the PCT application by the present applicant. As shown in FIG. 10A, a sidewall memory device 100 is a device constituted by a gate electrode 104 formed on a semiconductor layer 102 through a gate insulating film 103, a channel region 101 formed under the gate electrode 104, diffusion regions 105 and 106 formed at the both sides of the channel region 101 and having a conductivity type opposite to that of the channel region 101, and memory functional bodies 107 and 108 formed on the both sidewalls of the gate electrode 104 and respectively having a function for holding electric charges. FIG. 10B shows symbols of the sidewall memory device. In FIG. 10B, a node G, node S, and node D denote the gate electrode 104, a source electrode 105, and a drain electrode 106 respectively and m1 and m2 denote memory functional bodies.

To program data in the memory functional body m1, a high voltage is applied to the gate G, a high voltage is applied to the node S, and the node D is set to the GND level to supply a current from the node S to the node D. Hot electrons thereby generated are injected into the memory functional body m1 and data is programmed. However, to program data in the memory functional body m2, voltage conditions of the nodes S and D are reversed to change the current flowing direction from the node D to the node S.

Then, operations for reading information from a memory functional body are described below. To read the information programmed in the memory functional body m1, a voltage such as 3 V is applied to the node G and a voltage of 1.2 V is applied to the node D to set the node S to the GND level. In this case, when electrons are not accumulated in the memory functional body m1, a drain current easily flows. However, when electrons are accumulated in the memory functional body m1, an inversion layer is not easily formed nearby the memory functional body m1 and the drain current does not easily flow. By sensing the intensity of the drain current, it is possible to read stored information from the memory function body m1. In this case, whether electrons are accumulated in the memory functional body m1 does not influence the drain current because the vicinity of the node D is pinched off. To read information from the memory functional body m2, it is only necessary to replace the voltage condition of the node S with that of the node D. Thus, it is possible to store and read two-bit information in and from one memory device.

Figure 11:
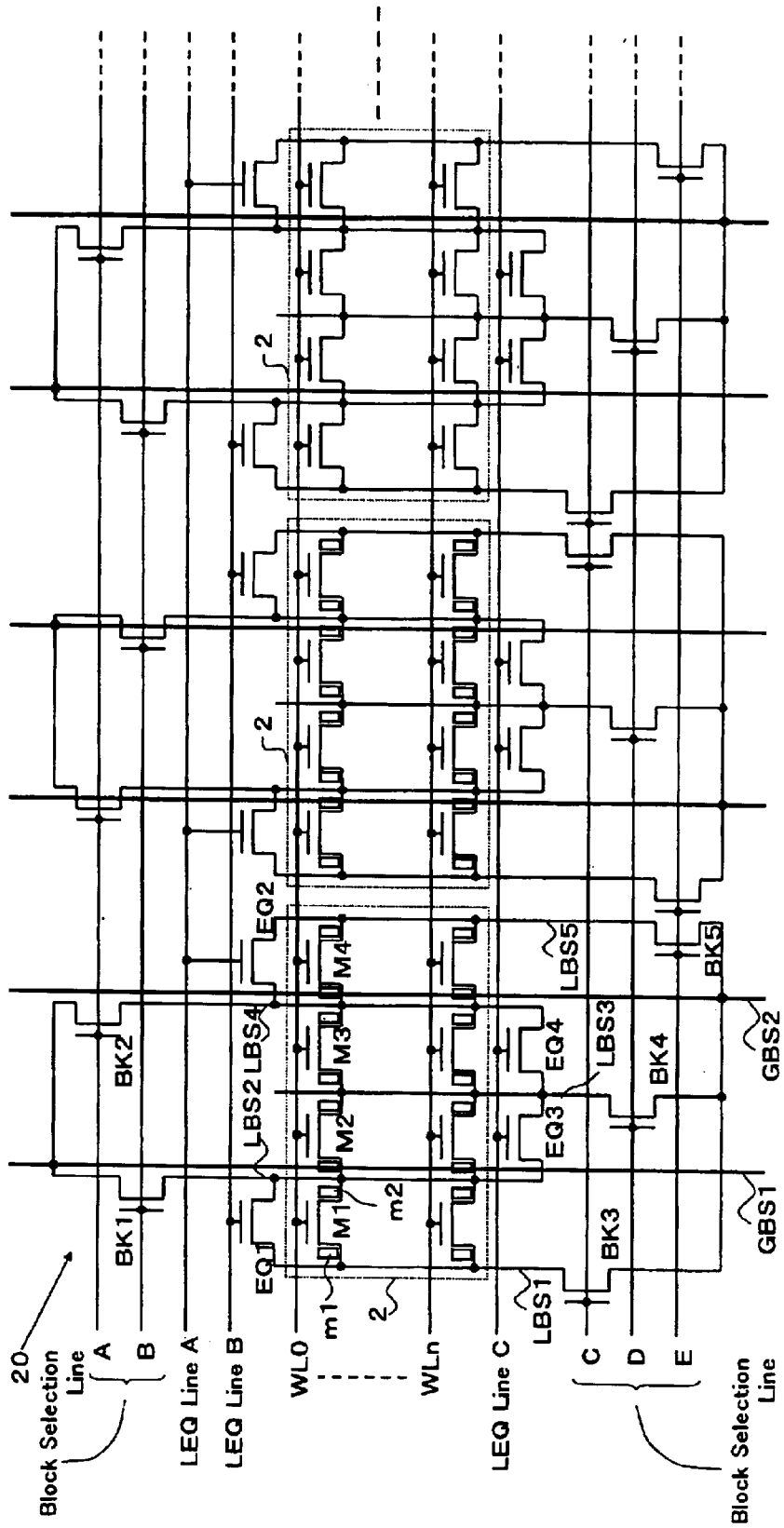
FIG. 11 is an essential-portion circuit diagram showing another embodiment using a side-wall memory device as a memory cell of a memory cell array configuration of a semiconductor memory device of the present invention.

Then, a memory cell array configuration of the present invention using the above sidewall memory device as a memory cell is described below. FIG. 11 shows the memory cell array configuration. The configuration of the memory cell array 20 shown in FIG. 11 is substantially the same as the configuration of the memory cell array 10 of the second embodiment shown in FIG. 3 but the configuration of the memory cell array 20 is different from that of the memory cell array 10 in that the memory device of the memory cell is replaced with a sidewall memory device. As described above, in the case of a sidewall memory device, however, the function of a bit line is replaced with that of a virtual ground line depending on a memory functional body in one memory cell selected by a bit line or virtual ground line to be connected to the node S and node D. Therefore, in the case of the embodiment in FIG. 11, a bit line and a virtual ground line are not purposely differentiated but they are referred to as bit-source line.

Then, programming and reading operations of the memory cell array 20 shown in FIG. 11 are described below. In FIG. 11, it is assumed that m1 and m2 of the memory cell M1 are memory functional bodies of a sidewall memory device. A case of applying the programming operation to the memory functional body m2 is described. The word line WL0 is first selectively set to a high-level voltage. Then, a global bit-source line GBS1 is set to a high-level voltage and a global bit-source line GBS2 is set to the low level (GND level). Then, the block selection lines A and B are set to the high level so that the first selection transistors BK1 and BK2 are turned on and the block selection line C is set to the high level so that the second selection transistor BK3 is turned on. At the same time, an LEQ line A is set to the high level so that the switching transistor EQ2 is turned on and an LEQ line C is set to the high level so that the switching transistors EQ3 and EQ4 are turned on. By setting the above states, a current route is formed from a bit-source line LBS2 to a bit-source line LBS1 through the memory cell M1 and the current from the bit-source line LBS2 to the bit-source line LBS1 flows through the memory cell M1. As a result, electrons are injected into the memory functional body m2 and the programming operation is executed. Moreover, by setting the above selective state, the bit-source lines LBS2, LBS3, and LBS4, and LBS5 are set to the same potential by the switching transistors EQ3, EQ4, and EQ2 but no current flows through the memory cell M2, M3, or M4. Therefore, the programming operation is not applied to the memory cells.

Then, a case of applying the programming operation to the memory functional body m1 of the memory cell M1 is described. A block selection line and LEQ line are controlled the same as the case of the operation for programming data in the memory functional body m2. Under the above state, by setting the global bit-source line GBS1 to the GND level and the global bit-source line GBS2 to a high-level voltage, a current flows from the bit-source line LBS1 to the bit-source line LBS2 through the memory cell M1. As a result, electrons are injected into the memory functional body m1 and the programming operation is executed. In this case, because the bit-source lines LBS2, LBS3, and LBS4 become the same potential at the GND level but no current flows through the memory cell M2, M3, or M4, the programming operation is not applied to the memory cells.

In the case of the memory cell array 20 in FIG. 11, data can be programmed in the memory functional body at the bit-source line LBS2 of the memory cell M2 by turning on the first selection transistor BK1, second selection transistors BK4 and BK5, and switching transistors EQ1 and EQ2 and setting the global bit-source line GBS1 to the high level, and the global bit-source line GBS2 to the GND level. Moreover, data can be programmed in the memory functional body at the bit-source line LBS3 of the memory cell M2 by setting the global bit-source line GBS1 to the GND level and the global bit-source line GBS2 to the high level. The programming operation applied to the memory functional body at the bit-source line LBS2 of the memory cell M2 is different from the programming operation applied to the memory cell M2 only in that voltage conditions of the global bit-source lines GBS1 and GBS2 are reversed.

Data can be programmed in the memory functional body at the bit-source line LBS3 of the memory cell M3 by turning on the first selection transistor BK2 and second selection transistors BK3 and BK4 and switching transistors EQ1 and EQ2 and setting the global bit-source line GBS1 to the GND level and the global bit-source line GBS2 to the high level. Data can be programmed in the memory functional body at the bit-source line LBS4 of the memory cell M3 by setting the global bit-source line GBS1 to the high level and the global bit-source line GBS2 to the GND level. The programming operation applied to the memory functional body of the memory cell M3 at the bit-source line LBS3 is different only in the voltage conditions of the global bit-source lines GBS1 and GBS2 are reversed.

Data can be programmed in the memory functional body at the LBS4 of the memory cell M4 by turning on the first selection transistors BK1 and BK2, second selection transistor BK5, and switching transistors EQ1, EQ3, and EQ4 and setting the global bit-source line GBS1 to the high level and the global bit-source line GBS2 to the GND level. Data can be programmed in the memory functional body at the LBS5 of the memory cell M4 by setting the global bit-source line GBS1 to the GND level and the global bit-source line GBS2 to the high level. The programming operation applied to the memory functional body at the LBS4 of memory cell M4 is different only in the voltage conditions of the global bit-source lines GBS1 and GBS2 are reversed.

Figure 12:
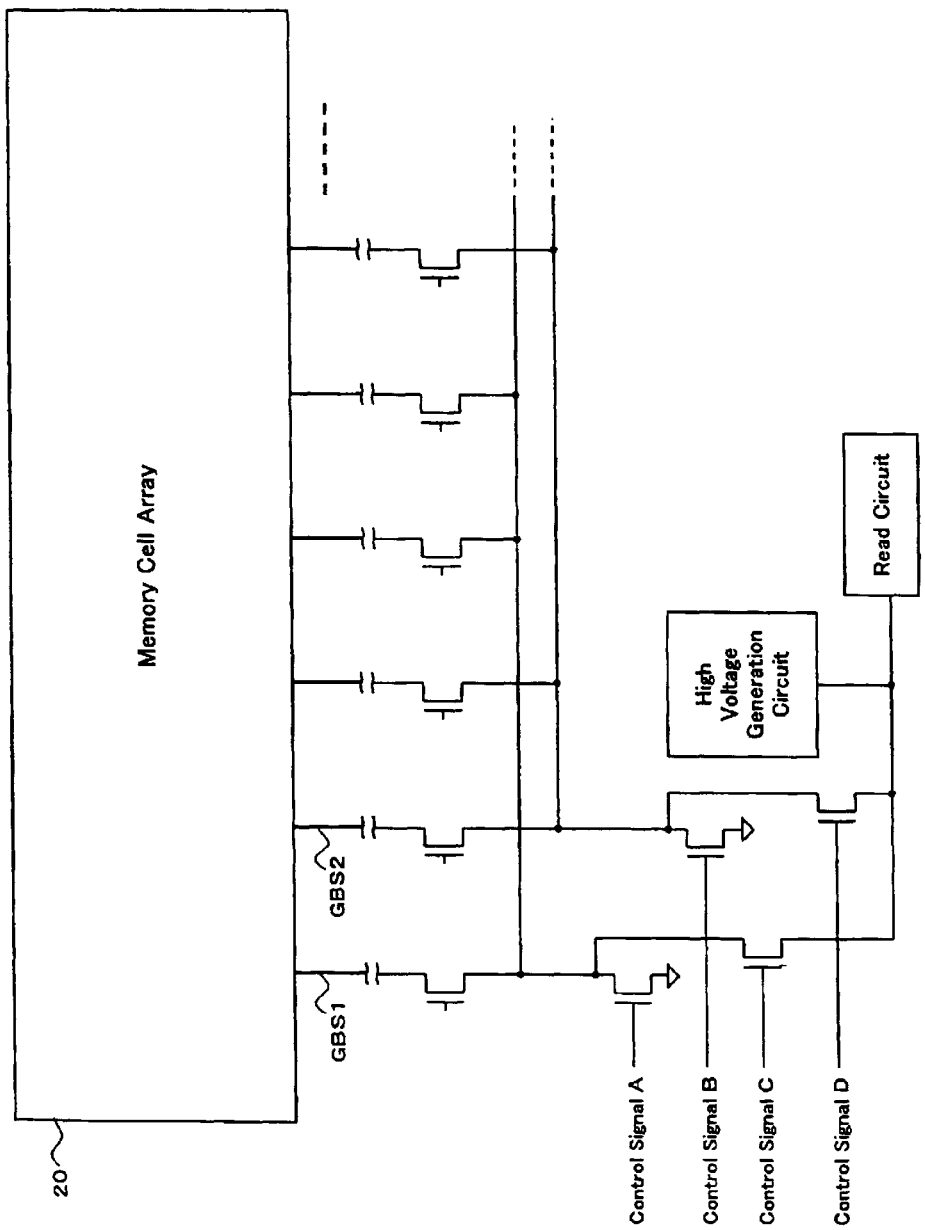
FIG. 12 is an example of circuit diagram showing a circuit configuration of a circuit for supplying a programming voltage to a global bit/source line of a memory cell array configuration of a semiconductor memory device of the present invention.

FIG. 12 shows an example of circuit configuration of a circuit for supplying a high-level voltage and low-level voltage to the global bit-source lines GBS1 and GBS2 respectively. By setting the control signals A and D to the high level and the controls signals B and C to the GND level, it is possible to set the global bit-source line GBS1 to the GND level and the global bit-source line GBS2 to the high level. Operations of the control signals A, B, C, and D can be realized by controlling them by address signals input to a semiconductor memory device. Moreover, it is possible to execute these controls at the same address in accordance with time sharing, that is, serial operation.

Then, the reading operation is described. The reading operation also makes it possible to read information from two memory functional bodies of a memory cell in accordance with the same procedure as the programming operation. In this case, it is assumed that high-level voltages to be applied to the global bit-source lines GBS1 and GBS2, word line WL, block selection lines A to E, and LEQ lines A to C are voltages most suitable for operations of the lines respectively.

As described above, according to the present invention, it is possible to increase the number of memory cells from which data will be read onto the same word line compared to the case of a conventional memory cell array configuration. Moreover, the present invention can be effectively used as an advanced memory array configuration for reading data from a lot of memory cells through one-time reading operation and performing the subsequent reading operation at a high speed.

Although the present invention has been described in terms of a preferred embodiment, it will be appreciated that various modifications and alternations might be made by those skilled in the art without departing from the spirit and scope of the invention. The invention should therefore be measures in terms of the claims which follow.

What is claimed is:

1. A semiconductor memory device comprising a memory cell array in which memory cells respectively having one first electrode and a pair of second electrodes and capable of reading stored contents correspondingly to the potential of said first electrode in accordance with a state of the electrical connection between said second electrodes are arranged in the row and the column directions like a matrix, wherein said memory cell array is constituted by connecting the first electrodes of said memory cells in the same row to a common word line, connecting said second electrodes each other between two of said memory cells adjacent to each other in the row direction, connecting one-hand said second electrodes in said memory cells in the same column to a common bit line, and connecting the other-hand said second electrodes in said memory cells in the same column to a common virtual ground line and moreover constituted by being divided into at least a plurality columns of subarrays, memory cell columns at the both ends of said subarrays are constituted so that said second electrodes are not connected each other between two of said memory cells adjacent to each other in the row direction at the both sides of boundaries between said subarrays but they are separated from each other and respectively connected to an independent bit line or virtual ground line, and one of said word lines, one of said bit lines, and one of said virtual ground lines are selected for each of said subarrays and one memory cell from which data will be read is selected.

2. A semiconductor memory device comprising a memory cell array in which memory cells respectively having one first electrode and a pair of second electrodes and capable of reading stored contents correspondingly to the potential of said first electrode in accordance with a state of the electrical connection between said second electrodes are arranged in the row and the column directions like a matrix, wherein said memory cell array is constituted by connecting the first electrodes of said memory cells in the same row to a common word line, connecting said second electrodes each other between two of said memory cells adjacent in the row direction, connecting one-hand said second electrodes in said memory cells in the same column to a common bit line, and connecting the other-hand said second electrodes in said memory cells to a common virtual ground line and moreover constituted by being divided into at least a plurality columns of subarrays, in the case of memory cell columns at the both ends of said subarrays, said second electrodes are not connected each other between two of said memory cells adjacent in the row direction at the both sides of boundaries between said subarrays but they are separated from each other and connected to independent bit lines or virtual ground lines, and each of said bit lines and each of said virtual ground lines respectively have functions of the both and when one of them executes the function of the other, the other executes the function of the former.

3. The semiconductor memory device according to claim 1, wherein each of said bit lines and each of said virtual ground lines respectively have functions of the both and when one of them executes the function of the other, the other executes the function of the former.

4. The semiconductor memory device according to claim 1, wherein the number of columns of said memory cells constituting said subarrays is 4.

5. The semiconductor memory device according to claim 1, wherein said bit lines are connected to a common global bit line through a first selection transistor and said virtual ground lines are connected to a common global virtual ground line through a second selection transistor for each of said subarrays.

6. The semiconductor memory device according to claim 1, wherein a charging circuit is included which supplies a predetermined charging voltage to some or all of said bit lines and virtual ground lines of said subarrays in order to execute the reading operation.

7. The semiconductor memory device according to claim 6, wherein said bit lines are connected to a common global bit line through a first selection transistor and said virtual ground lines are connected to a common global virtual ground line through a second selection transistor, and said charging circuit charges said bit lines and said virtual ground lines to be charged through said global bit line and said global virtual ground line.

8. The semiconductor memory device according to claim 7, wherein in said subarrays including said memory cells from which data will be read, at least one of said bit lines and one of said virtual ground lines to be connected only to said memory cells from which data will not be read are included as one of said bit lines and one of said virtual ground lines to be charged correspondingly to positions of said memory cells from which data will be read in said subarrays, and said charging circuit charges said bit lines and said virtual ground lines to be charged at the time of the reading operation.

9. The semiconductor memory device according to claim 7, wherein in said subarrays including said memory cells from which data will be read, at least one of said bit lines and one of said virtual ground lines to be connected only to said memory cells from which data will not be read are included as one of said bit lines and one of said virtual ground lines to be charged correspondingly to positions of said memory cells from which data will be read in said subarrays, and said charging circuit charges said bit lines and said virtual ground lines to be charged during a charging period following the reading operation.

10. The semiconductor memory device according to claim 1, wherein a switching transistor is set between said bit lines and said virtual ground lines adjacent to each other in said subarrays.

11. The semiconductor memory device according to claim 10, wherein the number of columns of said memory cells constituting said subarrays is 4 and two out of four of said switching transistors set to each of said subarrays are controlled in common and two other switching transistors are controlled independently.

12. The semiconductor memory device according to claim 10, wherein in said subarrays including said memory cells from which data will be read, said switching transistors set between said bit lines and said virtual ground lines to be connected to said memory cells from which data will be read are turned off at the time of the reading operation.

13. The semiconductor memory device according to claim 10, wherein in said subarrays including said memory cells from which data will be read, said switching transistors set between said bit lines and said virtual ground lines to be connected to said memory cells from which data will be read are turned off during a charging period following the reading operation.

14. The semiconductor memory device according to claim 1, wherein said bit lines are connected to a common global bit line through a first selection transistor and said virtual ground lines are connected to a common global virtual ground line through a second selection transistor, and a grounding switch transistor to be electrically connected with a ground line is set to said global bit line and said global virtual ground line respectively.

15. The semiconductor memory device according to claim 1, wherein said bit lines are connected to a common global bit line through a first selection transistor and said virtual ground lines are connected to a common global virtual ground line through a second selection transistor for each of said subarrays, and two of said first selection transistor or two of said second selection transistor to be connected to said bit line or said virtual ground line adjacent to each other at the both sides of boundaries between said subarrays are respectively controlled by a common control signal.

16. The semiconductor memory device according to claim 1, wherein said memory cells are respectively constituted by a flash memory device or variable resistance device.

17. The semiconductor memory device according to claim 1, wherein said memory cells respectively have a MOSFET structure and are respectively constituted by a sidewall memory device having a memory functional body on the sidewall of at least either of the drain side and source side for a gate.

18. The semiconductor memory device according to claim 17, wherein a circuit for supplying programming voltages different from each other and said memory cell array are constituted so that the voltages can be applied to said bit lines and said virtual ground lines to be connected to said memory cells in which data will be programmed for programming operations of said memory cells in said subarrays.

19. The semiconductor memory device according to claim 18, wherein said sidewall memory device;

has a memory functional body at the both of the drain side and source side to a gate, controls voltages to be applied to said bit lines and said virtual ground lines to be connected to said selected memory cells in accordance with a memory-functional-body selection signal for selecting either of said memory functional bodies in said memory cells, and applies the programming operation or reading operation to said two memory functional bodies respectively by changing current directions for said selected memory cells in accordance with said voltage control.

20. The semiconductor memory device according to claim 19, wherein said memory-functional-body selection signal serves as a part of an address signal.

21. The semiconductor memory device according to claim 19, wherein by selecting one of said memory cells and changing said memory-functional-body selection signal, a voltage to be applied to said bit lines and said virtual ground lines to be connected to said selected memory cells is reversed before and after the change of said memory-functional-body selection signal to continuously apply the programming operation or reading operation to said two memory functional bodies of said selected memory cells.

* * * * *